United States Patent
Tsukamoto

[11] Patent Number: 6,042,613
[45] Date of Patent: Mar. 28, 2000

[54] LSI DESIGN AIDING APPARATUS

[75] Inventor: Yasutaka Tsukamoto, Hyogo, Japan

[73] Assignee: Ricoh Company, Ltd., Japan

[21] Appl. No.: 08/992,258

[22] Filed: Dec. 17, 1997

[30] Foreign Application Priority Data

Dec. 26, 1996 [JP] Japan ................................. 8-347368

[51] Int. Cl.[7] ................................................ G06F 17/50
[52] U.S. Cl. ............................... 716/18; 716/2; 703/15
[58] Field of Search ........................ 395/500.02–500.19, 395/500.34–500.37, 500.39

[56] References Cited

U.S. PATENT DOCUMENTS

| | | | |
|---|---|---|---|
| 5,349,542 | 9/1994 | Brasen et al. | 395/500.36 |
| 5,436,849 | 7/1995 | Drumm | 395/500.19 |
| 5,477,474 | 12/1995 | Southgate et al. | 395/500.36 |
| 5,623,418 | 4/1997 | Rostoker et al. | 395/500.02 |
| 5,802,349 | 9/1998 | Rigg et al. | 395/500.03 |
| 5,831,869 | 11/1998 | Ellis et al. | 395/500.07 |
| 5,838,947 | 11/1998 | Sarin | 395/500.35 |
| 5,841,674 | 11/1998 | Johannsen | 395/500.13 |
| 5,872,952 | 2/1999 | Tuan et al. | 395/500.35 |

FOREIGN PATENT DOCUMENTS 2-136755 of 1990 Japan ........................... G01R 21/133

*Primary Examiner*—Paul R. Lintz
*Assistant Examiner*—Phallaka Kik
*Attorney, Agent, or Firm*—Dickstein Shapiro Morin & Oshinsky LLP

[57] ABSTRACT

An LSI design aiding apparatus includes an operating-part net list generation unit for generating an operating-part net list from a net list of a logical circuit, the net list including information relating to a plurality of logical elements in the logical circuit and information relating to connections involving the plurality of logical elements, and the operating-part net list describing an operating part of the logical circuit which is in operation during a predetermined logical operation, so as to perform an estimation of current consumption, synthesis of the logical circuit adapted for low power consumption, and generation of layout data adapted for low power consumption.

5 Claims, 7 Drawing Sheets

F I G. 7A
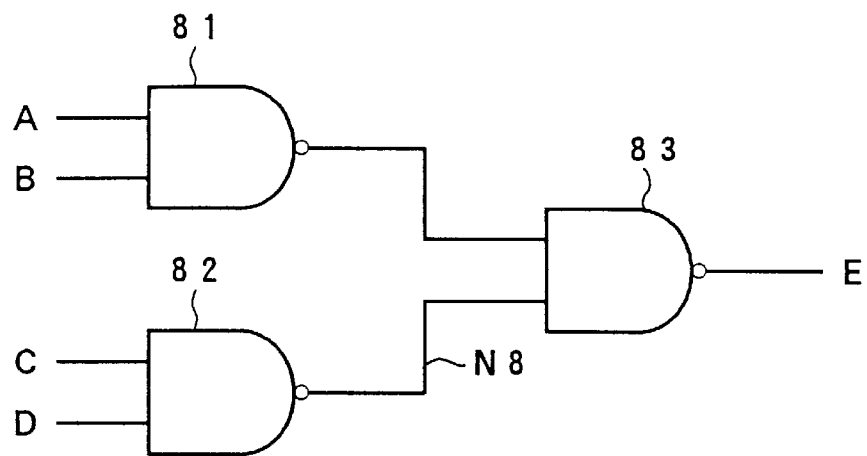
F I G. 7B
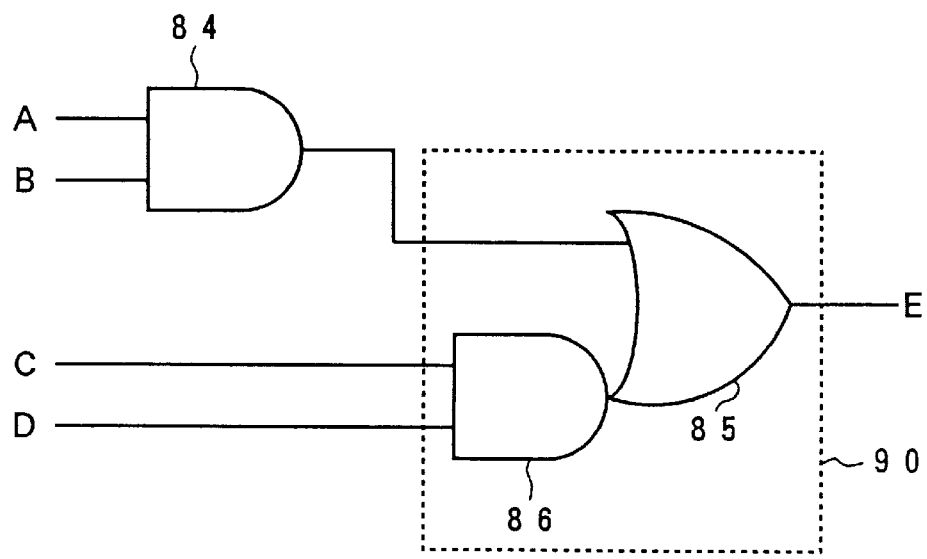

LSI DESIGN AIDING APPARATUS

BACKGROUND OF THE INVENTION

1. Field of the Invention

The present invention generally relates to LSI design aiding apparatuses and, more particularly, to an LSI design aiding apparatus in which estimation of electric current consumption is provided.

2. Description of the Related Art

Recently, mobile information tools such as mobile phones and notebook computers are widely used. With this, there is a growing demand for reduced power consumption. LSI logic circuits are designed with strong emphasis on reducing power consumption. Associated with this, there is a need to precisely estimate current consumption in the designed circuit. Better estimation of current consumption can be made on the transistor level rather than on the level of gates including individual AND, OR, NOT logical elements. However, estimation of current consumption in an integrated circuit on the transistor level requires a relatively long period of time. With the present-day level of integration, it is difficult, on a practical level, to estimate current consumption in an integrated circuit on the transistor level.

Japanese Laid-Open Patent Application No. 2-136755 discloses a method for estimating current consumption on the gate level. The disclosed method involves the steps of executing a logical simulation in a target logic circuit subject to estimation, determining the number of events at the output terminals of the logical elements based on the result of the simulation, and estimating the current consumption of the whole circuit based on the number of events determined and predetermined information relating to the current consumed by the logical elements.

However, the conventional method for estimating the consumed current on the gate level has a drawback in that such a method is less precise than a method for transistor-level estimation of the consumed current. The transistor-level estimation of the consumed current has a drawback in that it takes so long that it cannot be practically applied to a large-scale integration circuit. Thus, the conventional estimation method does not provide precise and efficient estimation of the consumed current so that it is difficult to design a logical circuit of low power consumption based on an estimation of the consumed current obtained by the conventional method.

SUMMARY OF THE INVENTION

Accordingly, a general object of the present invention is to provide an LSI design aiding apparatus in which the aforementioned drawback is eliminated.

Another and more specific object of the present invention is to provide an LSI design aiding apparatus whereby a current consumption can be precisely estimated in a short period of time and a logical circuit with a low current consumption can be designed.

The aforementioned objects can be achieved by an LSI design aiding apparatus for aiding design of a logical circuit in which only a portion of the logical circuit is operated during a predetermined logical operation, comprising: operating-part net list generation means for generating an operating-part net list describing an operating part of the logical circuit which is operated during the predetermined logical operation, based on a net list describing a construction of the logical circuit.

By using the operating-part net list, it is possible to estimate current consumption more precisely and efficiently than the related art.

BRIEF DESCRIPTION OF THE DRAWINGS

Other objects and further features of the present invention will be apparent from the following detailed description when read in conjunction with the accompanying drawings, in which:

FIGS. 7A and 7B are circuit diagrams illustrating the operation of a logical synthesis part.

DESCRIPTION OF THE PREFERRED EMBODIMENTS

Figure 2:
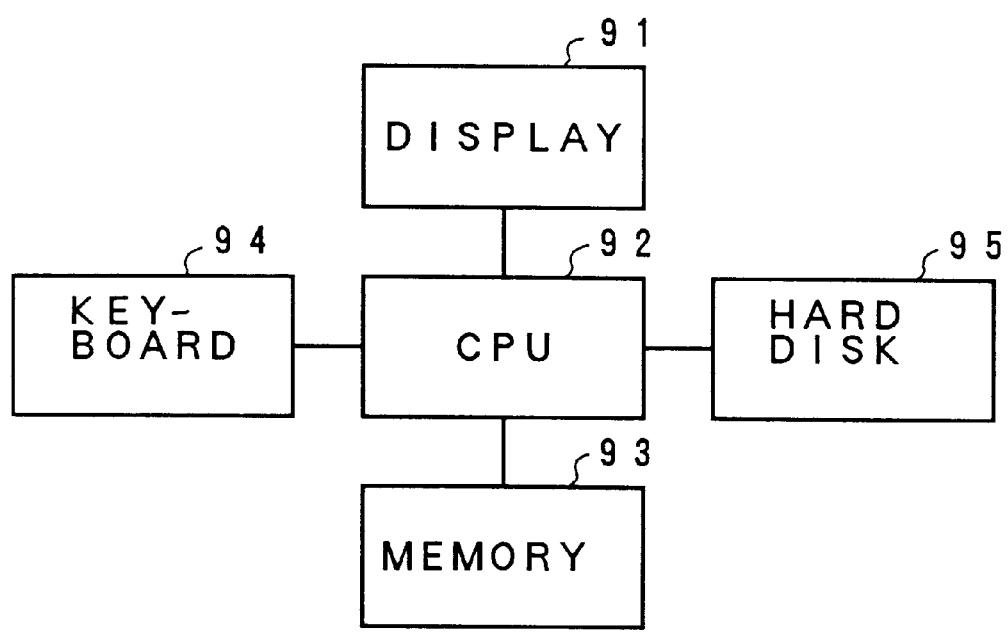
FIG. 2 is a block diagram showing hardware construction of the LSI design aiding apparatus according to the embodiment.

FIG. 2 is a block diagram showing hardware construction of an LSI design aiding apparatus according to the embodiment of the present invention. The hardware of the LSI design aiding apparatus includes a CPU 92, a memory 93, a hard disk unit 95, an input device 94 such as a keyboard and a display 91 such as a CRT display. The memory 93, the hard disk unit 95, the input device 94 and the display 91 are connected to the CPU 92. By operating the CPU 92 according to a program loaded into the memory 93, various functions for aiding the design of logical circuitry are provided.

Functionally, the LSI design aiding apparatus according to the embodiment features a operating-part net list generation part 4 for generating an operating-part net list 5 that describes those parts of the logical circuitry that are operated in a given operation. By using the operating-part net list 5, the consumed current can be precisely estimated and the logical synthesis and circuit layout ensuring low current consumption are provided.

Figure 1:
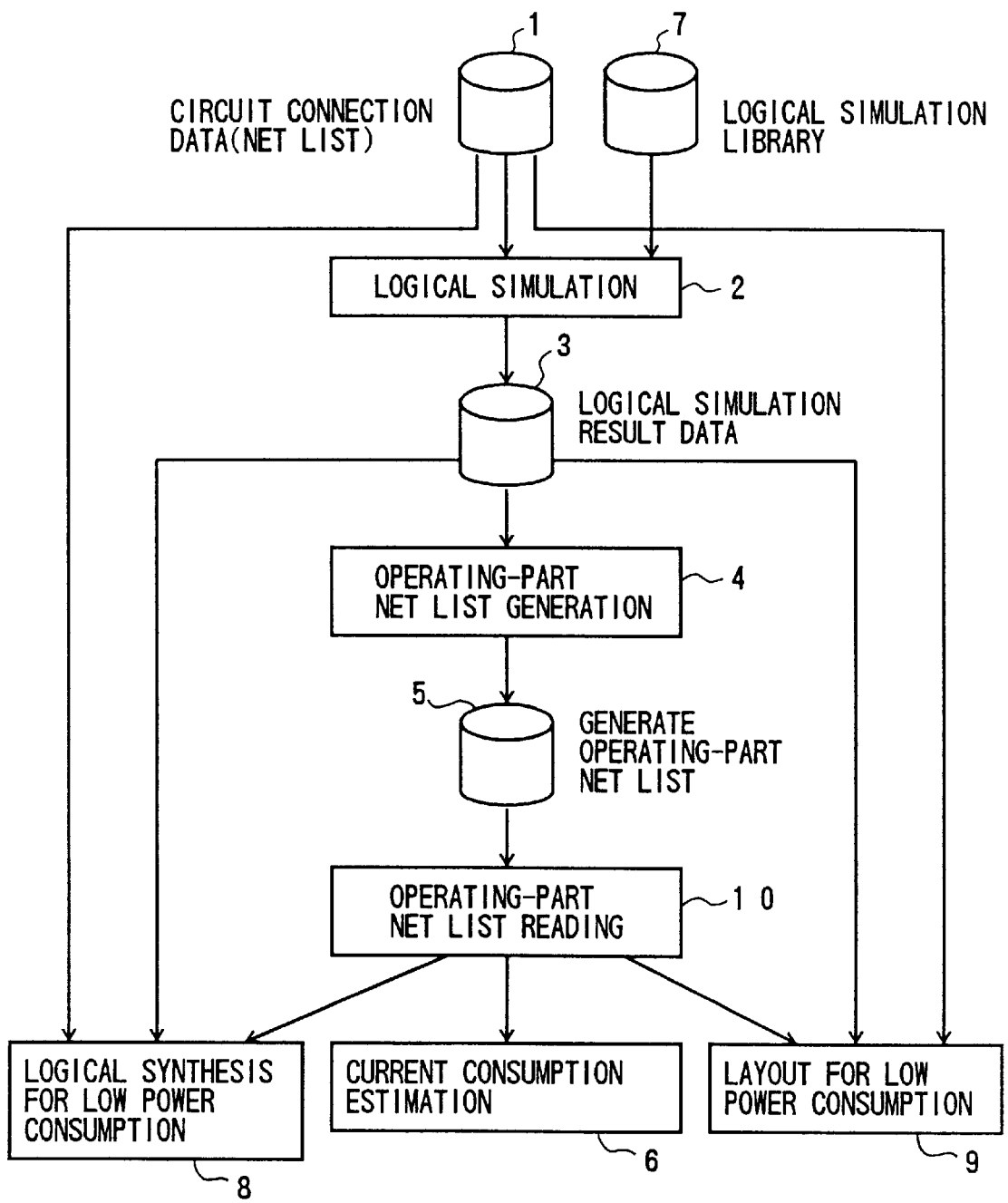
FIG. 1 is a functional block diagram showing the functional construction of an LSI design aiding apparatus according to an embodiment of the present invention.

FIG. 1 is a functional block diagram showing the functional construction of the LSI design aiding apparatus according to the embodiment. As shown in FIG. 1, the LSI design aiding apparatus comprises a logical simulation part 2, the operating part net list generation part 4, an operating-part net list reading part 10, a logical synthesis part 8, a current consumption estimation part 6 and a layout part 9. Since the LSI design aiding apparatus of the embodiment is directed to logical design of an LSI, it has a logical simulation library. Data of the logical simulation library is stored in the hard disk unit 95. The hard disk unit 95 also stores a net list 1 which is circuit connection data loaded from the hard disk unit 95 in accordance with an instruction input via the input device 94, logical simulation result data 3 obtained as a result of a simulation by the logical simulation part 2, and the operating-part net list 5 generated by the operating-part net list generation part 4.

A further description will be given, with reference to the drawings, of the construction and operation of the LSI design aiding apparatus according to the embodiment. The logical simulation part 2 reads information (net list 1), loaded from the hard disk unit 95 in accordance with an instruction input via the input device 94, relating to connections involving the entirety of the logical circuits, and a logical simulation library 7. Thereupon, the logical simulation part 2 executes a logical simulation and stores the logical simulation result data 3 in the hard disk unit 95. The logical simulation result data 3 lists moment-by-moment logical values assumed by the nodes in the circuitry. The logical simulation in the embodiment may be performed by a conventional method.

Figure 6:
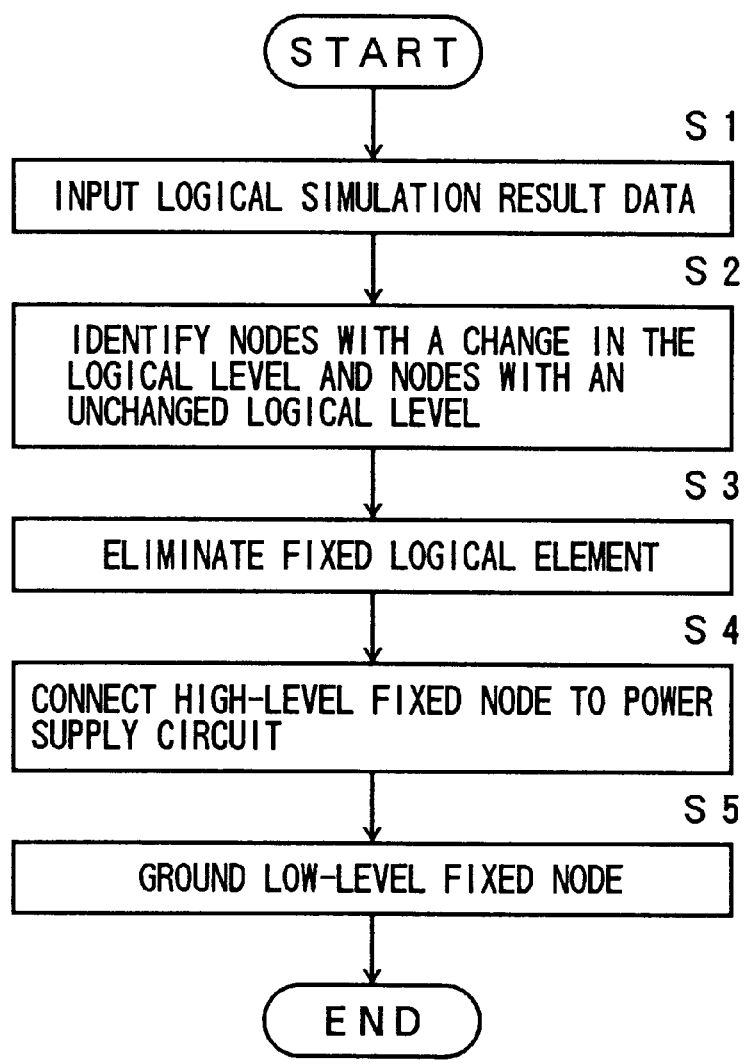
FIG. 6 is a flowchart showing a process performed by the operating-part net list generation means.

FIG. 6 is a flowchart showing the operation performed by the operating-part net list generation part 4. In step S1, the logical simulation result data is input. In step S2, nodes with a change in the logical level and nodes with the unchanged logical level are identified. In step S3, the result of step S2 is referred to so as to eliminate those logical elements in which the logical level remained unchanged at any of the nodes connected thereto during the logical simulation (hereinafter, such a logical element will be referred to as a fixed logical element). This leaves those logical elements in which a change in the logical level occurred in at least one of the connected nodes during the logical simulation. Hereinafter, such logical elements will be referred to as operating logical elements. In step S4, those of the nodes connected to the operating logical elements in which the logical level remained low during the logical simulation (hereinafter, such nodes will be referred to as low-level fixed nodes) are grounded. In step S5, those of the nodes connected to the operating logical elements in which the logical level remained high during the logical simulation (hereinafter, such nodes will be referred to as high-level fixed nodes) are connected to a power supply circuit (VCC). In this way, the operating-part net list generation part 4 generates the operating-part net list 5 and stores the operating-part net list 5 thus generated in the hard disk unit 95 by executing steps S1–S5. With this operation, the fixed logical elements in which the logical level remained unchanged during the logical simulation are eliminated so that an operating logical circuit described by the operating-part net list 5 composed of information relating to the operating logical elements and information relating to connections involving the operating logical elements.

Figure 3:
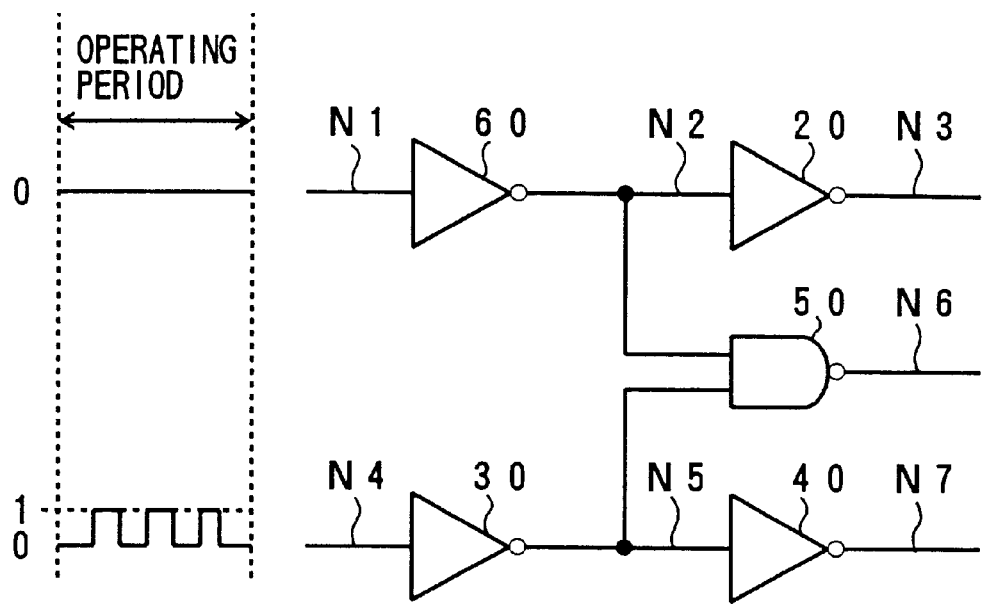
FIG. 3 is a circuit diagram of a logical circuit illustrating the operation of operating-part net list generation means.
Figure 4:
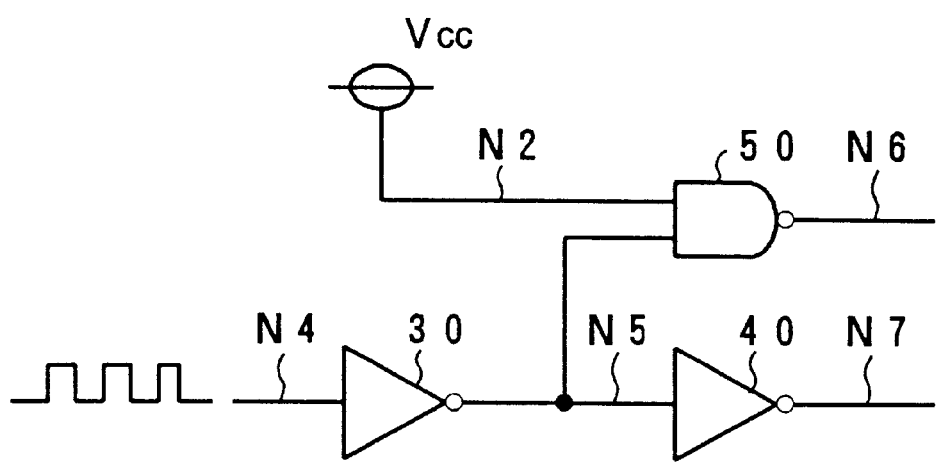
FIG. 4 is a circuit diagram of a logical circuit obtained by modifying the logical circuit of FIG. 3 by the operating-part net list generation means.

A detailed description will now be given, with reference to FIGS. 3 and 4, of the operating-part net list generation part 4. FIGS. 3 and 4 show a positive logic operation. Referring to the logical circuit of FIG. 3, assuming that a signal that remains low during an operating period is input to node N1 and a signal that varies as shown is input to node N4. During the operation, node N2 remains high and node N3 remains low. The logical value at nodes N5, N6 and N7 varies during the operation. Thus, inverters 20 and 60 are fixed logical elements in which the logical level remains unchanged at any of the nodes connected thereto. Node N2 is a high-level fixed node and nodes N1 and N3 are low-level fixed nodes. Given such a result of analysis, the inverters 20 and 60, that is, the fixed logical elements are eliminated from the logical circuit of FIG. 3. Node N2, that is, the high-level fixed node, is connected to a power supply circuit (hereinafter, referred to as VCC). Thus, the operating-part net list generation part 4 generates a net list that describes the logical circuit of FIG. 4 relating to the operation and extracted from the logical circuit of FIG. 3.

Figure 5:
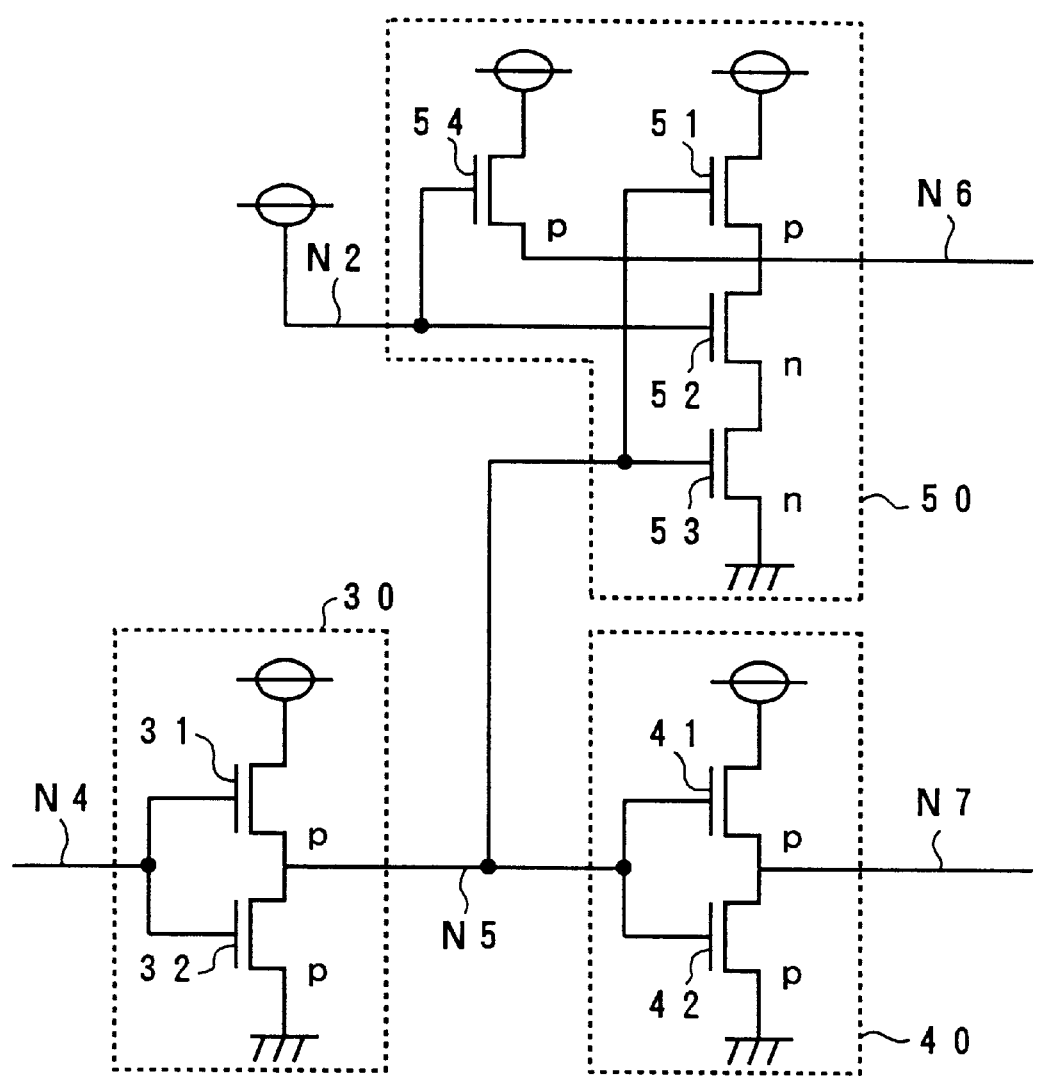
FIG. 5 is a circuit diagram of a transistor-level circuit that corresponds to the logical circuit of FIG. 4.

The current consumption estimation part 6 refers to the operating-part net list 5 input thereto via the operating-part net list reading part 10 so as to convert the gate-level logical circuit as shown in FIG. 4 into the transistor-level circuit as shown in FIG. 5. The current consumption estimation part 6 then makes an estimation of the current consumption based on the transistor-level logical circuit, using a circuit simulation technique. Referring to the transistor-level logical circuit of FIG. 5, a NAND gate 50 is composed of four transistors including p-channel transistors 51 and 54, and n-channel transistors 52 and 53. An inverter 40 is composed of a p-channel transistor 41 and an n-channel transistor 42. An inverter 30 is composed of a p-channel transistor 31 and an n-channel transistor 32.

The logical synthesis part 8 provided for low power consumption has a cell library. The logical synthesis part 8 refers to the logical simulation result data to modify the logical circuit described by the net list 1, so that the current consumption in the operating-part logical circuit described by the operating-part net list 5 is fed to the logical synthesis part 8 via the operating-part net list reading part 10. For example, when the operating logical circuit described by the operating-part net list 5 is composed of three NAND gates 81, 82 and 83, as shown in FIG. 7A, and when the logical simulation result shows that the logical level varies more frequently in a unit time at node N8 than at any other node, the current consumption can be reduced by reducing line capacitance at node N8. Thus, the logical synthesis part 8 converts the operating logical circuit as shown in FIG. 7A into a logical circuit composed of an AND gate 84 and a composite gate 90 embodied by a cell and having a logical operation function combining a logical sum 85 and a logical product. The present invention is not limited to an example of logical synthesis described with reference to FIGS. 7A and 7B. Other types of logical synthesis are of course conceivable for reduction of current consumption. Any type of logical synthesis technique adapted for reduction of current consumption in the operating logical circuit can be applied to the logical synthesis part 8.

The layout part 10 for low power consumption reads the net list 1 for the entirety of the circuit so as to provide wiring adapted for reduction of current consumption in the circuit part described by the operating-part net list 5 input to the layout part 10 via the operating-part net list reading part 10. More specifically, the layout part 10 provides wiring so as to reduce line capacitance in the circuit part described by the operating-part net list 5.

The LSI design aiding apparatus according to the embodiment described above is advantageously provided with the operating-part net list generation part 4 for generating the operating-part net list 5 describing only the operating logical circuit activated in a given logical operation, and with the current consumption estimation part 6 for generating the transistor-level operating logical circuit based on the operating-part net list 5 generated by the operating-part net list generation part 4 and for estimating the current consumption in the logical circuit based on the transistor-level operating logical circuit. Accordingly, the LSI design aiding apparatus according to the embodiment is capable of estimating the current consumption more efficiently and precisely than the conventional apparatus. The operating-part net list is particularly useful to estimate a current consumption occurring when only some of the elements of a logical circuit are operating. For example, a current consumption of a logical circuit of a mobile phone in a wait state can be advantageously estimated.

The LSI design aiding apparatus is also advantageously provided with the operating-part net list generation part 4 and the logical synthesis part 8 for low power consumption so that the operating logical circuit is modified to reduce current consumption in the operating logical circuit based on the logical simulation result and the operating-part net list 5. Further, the logical circuit described by the net list 1 is modified using the modified operating logical circuit. Accordingly, the logical circuit with a reduced current consumption is synthesized.

The LSI design aiding apparatus is also advantageously provided with the operating-part net list generation part 4 and the layout part 9 for low power consumption so that logical circuit layout adapted for low current consumption in the operating logical circuit is provided based on the logical simulation result and the operating-part net list 5. Accordingly, a logical circuit low in current consumption can be provided.

A description will now be given of variations of the above-described embodiment.

In the LSI design aiding apparatus according to the embodiment described above, estimation of the current consumption, logical circuit synthesis, logical circuit layout are provided based on the operating-part net list 5 generated by the operating-part net list generation part 4. According to a first variation, the LSI design aiding apparatus may further be provided with a delay time estimation part for estimating a delay time in a logical circuit. According to such an apparatus, a delay time can be estimated by performing a circuit simulation based on the operating-part net list 5. With such a construction, the delay time of the logical circuit can be estimated precisely and in a relatively short period of time.

In the LSI design aiding apparatus according to the embodiment, the current consumption estimation part estimates the current consumption using the operating-part net list 5 in which the fixed logical elements are eliminated. In this way, no consideration is given in the estimation to leak current in the fixed logical elements. According to a second variation, the current consumption may be estimated in two steps. In a first step, the current consumption is estimated according to the embodiment described already. In a second step, current consumption estimation that allows for leak current in the fixed logical elements is performed. With this arrangement, even more precise estimation of the current consumption is provided as compared to the LSI design aiding apparatus according to the embodiment described above.

The present invention is not limited to the above described embodiments, and variations and modifications may be made without departing from the scope of the present invention.

What is claimed is:

1. An LSI design aiding apparatus for aiding design of a logical circuit, said apparatus comprising:

a logical simulator for processing a net list describing a construction of said logical circuit and for simulating a predetermined logical operation, based on said net list, during which only an operating part of said logical circuit is operated; and operating-part net list generation means for generating an operating-part net list describing said operating part of said logical circuit which is operated during said predetermined logical operation and for eliminating a second portion of said logical circuit which is not operated during said predetermined logical operation, such that said second portion of said logical circuit is not included in said operating-part net list.

2. The LSI design aiding apparatus as claimed in claim 1, wherein said operating-part net list generation means comprises:

elimination means for eliminating, from said operating-part net list, logical elements constituting said logical circuit in which a logical level remains unchanged at any of terminals connected to the logical elements during said predetermined logical operation, based on a result of said simulation, and leaving operating logical elements constituting said logical circuit in which a change in a logical level occurred in at least one of said terminals of said operating logical elements during said predetermined operation;

connecting means for connecting nodes of said operating logical elements in which the logical level remains high during said predetermined logical operation, to a power supply circuit; and grounding means for connecting nodes of said operating logical elements in which the logical level remains low during said predetermined logical operation, to a ground.

3. The LSI design aiding apparatus as claimed in claim 1, further comprising:

current consumption estimation means for representing said operating part described by said operating-part net list generated by said operating-part net list generation means, by a transistor-level circuit, and estimating a current consumption in said logical circuit by performing a circuit simulation in said operating part represented by the transistor-level circuit.

4. The LSI design aiding apparatus as claimed in claim 1, further comprising:

logical synthesis means for modifying said operating part so as to reduce a current consumption in said logical circuit, based on said operating-part net list generated by said operating-part net list generation means.

5. The LSI design aiding apparatus as claimed in claim 1, further comprising:

layout means for redesigning said operating part so as to reduce a current consumption, based on said operating-part net list generated by said operating-part net list generation means.

* * * * *